United States Patent [19]

Akihama

[11] Patent Number: 5,194,420
[45] Date of Patent: Mar. 16, 1993

[54] OXIDE SUPER CONDUCTORS

[75] Inventor: Ryozo Akihama, Kumagaya, Japan

[73] Assignee: Chichibu Cement Co., Ltd., Tokyo, Japan

[21] Appl. No.: 520,326

[22] Filed: May 7, 1990

Related U.S. Application Data

[63] Continuation-in-part of Ser. No. 288,831, Dec. 23, 1988, abandoned.

[30] Foreign Application Priority Data

Dec. 25, 1987 [JP] Japan ............................. 62-328879

[51] Int. Cl.$^5$ ............................................. B32B 9/00
[52] U.S. Cl. ......................................... 505/1; 505/701; 505/702; 505/703; 505/704; 428/411.1; 428/426; 428/432; 428/433; 428/457; 428/688; 428/930
[58] Field of Search ......................... 505/1, 701–704; 428/688, 457, 411.1, 426, 432, 433, 930

[56] References Cited

U.S. PATENT DOCUMENTS 4,826,808  5/1989  Yurck et al. ............................. 505/1

FOREIGN PATENT DOCUMENTS 0300215  1/1989  European Pat. Off. .
0323239  7/1989  European Pat. Off. .
2646096  4/1978  Fed. Rep. of Germany .
WO89/01706  2/1989  World Int. Prop. O. .

OTHER PUBLICATIONS

Appl. Phys. Letts, vol. 51, No. 3, Jul. 20, 1987 pp. 203–204.
Japanese Journal of Applied Physics, vol. 26, No. 5, May 1987 pp. L832–L833 "Composition Dependence of Superconductivity in Y–Ba–(Ag,Cu)–O System".

Primary Examiner—Patrick J. Ryan
Assistant Examiner—W. Krynski
Attorney, Agent, or Firm—Nikaido Marmelstein Murray & Oram

[57] ABSTRACT

Disclosed here is a shaped article superconductor comprising platelets of superconducting oxide crystals which are normally anisotropic but in which said anisotropy is reduced by joining together the oxides superconductor crystallites with a normally conductive metal layer interposed therebetween. The separation distances of the platelets are, on the average, less than the coherence length of the normally conductive metal under conditions which render the oxide crystals superconductive.

6 Claims, 1 Drawing Sheet

OXIDE SUPER CONDUCTORS

This application is a continuation in part of application Ser. No. 288,831, filed Dec. 23, 1988, now abandoned, the entire contents of which are incorporated herein by reference.

BACKGROUND OF THE INVENTION

1. Field of the Invention

The present invention relates to an oxide superconductor in which the anisotropies of critical currents and critical magnetic fields resulting from the layer structure of oxide superconductor crystals are reduced in a shaped article comprising an aggregate of oxide superconductor crystals together with a conductive metal.

2. Description of the Prior Art

It has long been known that as some metals or alloys are cooled to the vicinity of absolute zero, their electrical resistance is reduced to zero. This property has been called superconductivity. Recent reports have revealed that certain metal oxide crystals, having the perovskite structure, show such superconductivity at relatively elevated temperatures.

These oxides of the perovskite structure have a transition temperature higher than the boiling point of nitrogen, and are therefore called the "high-temperature oxide superconductors". In view of their high transition temperature, they are now under study to put them to practical use. The superconductivity of such oxides is interesting but it has not been used for any practical conductor because of their critical current density is extremely low.

Since the perovskite high-temperature oxide superconductors are crystals having a layer structure, however, large anisotropies appear in their critical magnetic field $Hc_2$ and their critical current Jc. In thin-film single crystals, it is seen that there is a certain limitation on the direction of current flow.

In an aggregate of single crystals, therefore, the junction points of single crystals are directionally so random that current flow is impeded. In a polycrystal thin-film, on the other hand, no satisfactory superconductive contact has been achieved at the interfaces of single crystals.

In addition, when the oxide crystal superconductors have been formed into a wire or shield material by sintering, only a very limited superconductive contact area is obtained because, since they are sintered bodies, they are hence, microporous. This porosity interferes with current flow and therefore impedes superconductivity of the formed/shaped products.

SUMMARY OF THE INVENTION

The present invention has, as its objective, to solve the above problems, which has been accomplished by providing a shaped article comprising a crystalline oxide superconductor having satisfactory superconductivity in spite of the crystals being of a layer structure.

The oxide superconductor shaped articles of the present invention have been invented to provide a solution to such problems as mentioned above by providing superconduction at the junctions of the interfaces of crystals thereof at substantially the same level as exists in the bodies of the superconductor single crystals, and is characterized in that a thin layer of a normally conductive metal is interposed between oxide superconductor crystallites so as to conductively join the crystals together. The normally conductive, but not superconductive, metals interposed as very thin areas between the crystallites, appear to have been made superconductive by the condition and their proximity to the superconductive crystals.

The normally conductive metals, use may be made of gold Au, platinum Pt, silver Ag, aluminum Al, copper Cu, nickel Ni, indium In, tin Sn, lead Pb, titanium Ti, vanadium V, zirconium Zr, niobium Nb, hafnium Hf, tantalum Ta, tungsten W, molybdenum Mo and mercury Hg, or an alloy of two or more said elements each of which allows ready flow of the current therethrough between the superconductor crystals.

It is to be noted that the articles of this invention may also be made from a compound easily convertible into a conductive metal as detailed above by intermediate reaction thereof, such as, for instance, the reduction of silver oxide ($Ag_2O$) to silver. Thus, preformed, high temperature superconductive, generally flat oxide crystals can be combined with conductive, but not normally high temperature superconductive, metals or metal compounds, formed into a desired shape under conditions which minimize the spacing between crystals, and therefore the thickness of the conductive metal disposed between adjacent crystals, and then, if the metals are in compound form, convert them, in situ, to their conductive metal form.

It is an important aspect of this invention to provide a shaped article comprising layered, platelet form superconductive oxide crystals in which the platelets are sufficiently close packed that their separation distance is, at least on the average, not greater than the coherence length of the normally conductive metal which is disposed in the interstices between the platelets. This term, "coherence length", is defined as the leakage length of superconductive electron pairs in the normally conductive metal at a prescribed temperature and under the influence of a prescribed magnetic field. It is also to be understood that the thickness of the normally conductive metal layer may be determined based on the calculated coherence length due to the proximity effect. In a sandwich structure of a normal metal and a superconductor. Critical current density Jc is roughly as follows:

$$Jc \propto \exp \frac{-dn}{l\eta}$$

where $l\eta$ is a characteristic leakage length of the cooper pair on a normal metal (coherence length) and dn is the thickness of a normal metal layer. So, the large value of $l\eta$ and the small value of dn are favorable for Jc improvement by the proximity effect. The coherence length $\xi\eta$ is a function of temperature, electro resistivity, Fermi velocity in a normal metal and also magnetic field.

A typical value of $\xi\eta$ at 77K is about 450 Å for Ag.

Figure 1:
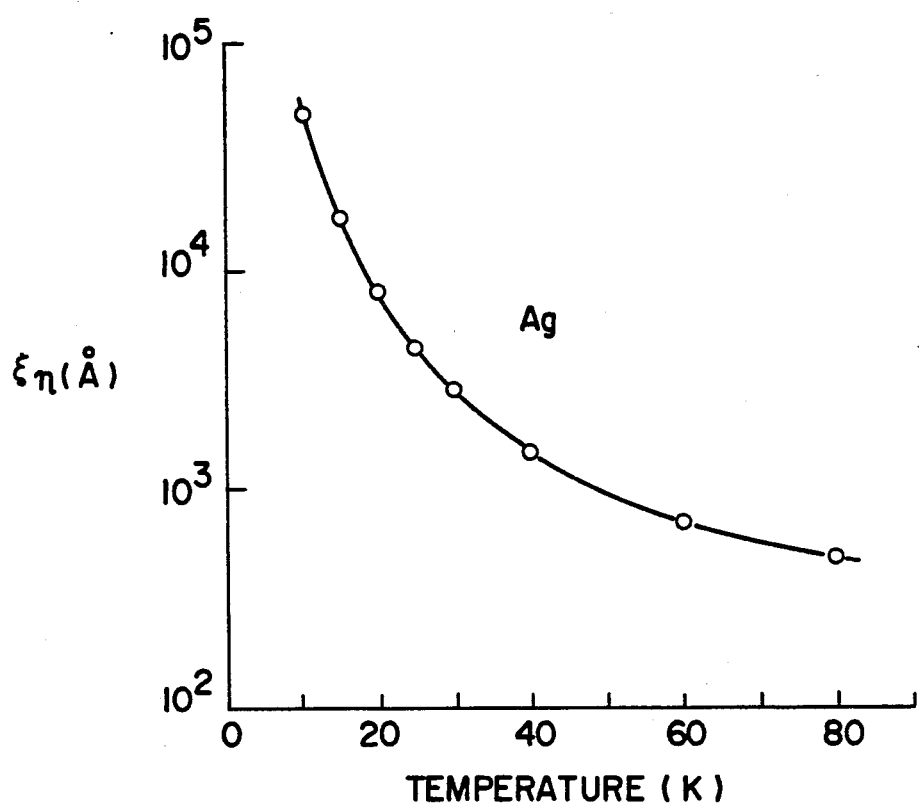
FIG. 1 shows the temperature of $\xi\eta$ for Ag.

In order to prepare such oxide superconductor shaped articles, powders of superconductor crystal platelets are mixed with powders of such a normally conductive metal as mentioned above; the mixture is inserted into a sheath of material formed of a normally conductive metal material; extruded therethrough;

rolled; swaged; and finally drawn into a fine wire or a thin shaped article.

DETAILED DESCRIPTION AND EXAMPLE OF THE INVENTION

First of all, 10% by volume of powders of a normally conductive metal, for example Ag (silver), were mixed with powders of superconducting crystal platelets of oxides of Y-Ba-Cu-O. In this case, the Ag powders had a particle size of 5–10 μm. The thus obtained mixture was put in a tube of Ag (silver) and subjected to wire drawing to adjust the thickness of the normally conductive layer which was then examined by using the transmission electron microscope and/or the scanning electron microscope. Then, Critical current values Jc were found at a temperature of 77° K.

As a result, it was found that a critical current value of about 300 A/cm$^2$ was obtained when the thickness of the interstitial normally conductive silver was about 10,000 to 5,000 Å, but reached 6,000 A/cm$^2$ when the interstitial thickness was less than 1,000 Å and reached as high as about 80,000 A/cm$^2$ when this thickness was reduced to less than 500 Å.

The shaped composite article made according to the above example was found to have a critical current value 100 times as large as that of a comparable fine wire made of the same superconductive polycrystals, based on the oxides of Y-Ba-Cu-O, without the silver.

The critical current (Jc) of shaped superconductors articles appears to be improved at the junctions of the single crystal interfaces in the aggregate by improving the intergrain bonding because when the thickness of the normally conductive metal layer is made substantially equal to or less than the length of coherence, then the passage of current between superconducting crystals through the normally conductive metal is facilitated by the proximity effect, resulting in superconduction of not only the compound perovskite crystal platelets, but the entire shaped article.

According to the present invention as explained above, it is possible to achieve greater improvements in the value of the critical current (Jc) through the oxides superconductor shaped article that comprises a polycrystal aggregate, having inherent anisotropy, and to facilitate the processing thereof, such as by wire drawing, by the lubrication of the added normally conductive metal, such as silver.

What is claimed is:

1. A shaped article having overall superconductivity comprising two distinct phases comprising: first a multiplicity of separate and distinct flat crystallite platelets of a high temperature superconductive oxide material, and second a normally conductive material interposed between and in conductive contact with said platelets; wherein the average separation spacing between the closest adjacent points of said platelets in which said normally conductive material exists is less than about 1000 Å under the conditions at which said crystallite platelets exhibit superconductivity.

2. A superconducting shaped article as claimed in claim 1 wherein said normally conductive material is disposed in said interstitial space in effective electrical contact with next adjacent platelets.

3. A superconducting shaped article as claimed in claim 1, wherein said normally conductive material is a metal having a coherence length of less than about 1000 Å.

4. A superconducting shaped article as claimed in claim 3 wherein said metal is at least one selected from the group consisting of gold, platinum, silver, aluminum, copper, nickel, indium, tin, lead, titanium, vanadium, zirconium, niobium, hafnium, tantalum, tungsten, molybdenum, mercury and alloys thereof.

5. A superconducting shaped article as claimed in claim 4 wherein said oxide crystallites are perovskites.

6. A superconducting shaped article as claimed in claim 1 in the form of a wire.

* * * * *